(12) United States Patent
Ooshima et al.

(10) Patent No.: US 12,557,212 B2
(45) Date of Patent: Feb. 17, 2026

(54) ELECTRONIC COMPONENT

(71) Applicant: Murata Manufacturing Co., Ltd., Nagaokakyo (JP)

(72) Inventors: Tomoya Ooshima, Nagaokakyo (JP); Yuuta Hoshino, Nagaokakyo (JP); Koichi Yamada, Nagaokakyo (JP); Miki Sasaki, Nagaokakyo (JP); Hironobu Kubota, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 375 days.

(21) Appl. No.: 18/486,635

(22) Filed: Oct. 13, 2023

(65) Prior Publication Data

US 2024/0040695 A1 Feb. 1, 2024

Related U.S. Application Data

(63) Continuation of application No. PCT/JP2022/015950, filed on Mar. 30, 2022.

(30) Foreign Application Priority Data

Jun. 15, 2021 (JP) .................. 2021-099716

(51) Int. Cl.
*H05K 1/03* (2006.01)
*H05K 3/10* (2006.01)

(52) U.S. Cl.
CPC .......... *H05K 1/0306* (2013.01); *H05K 3/102* (2013.01); *H05K 2201/017* (2013.01); *H05K 2201/09381* (2013.01)

(58) Field of Classification Search
CPC .................................................. H05K 1/0306
USPC ....................................................... 174/250
See application file for complete search history.

(56) References Cited

U.S. PATENT DOCUMENTS

2002/0027764 A1 3/2002 Kishimoto et al.
2021/0166846 A1* 6/2021 Yonezawa ........ H01C 17/06526

FOREIGN PATENT DOCUMENTS

| JP | H10106809 A | 4/1998 |
| JP | 2002043167 A | 2/2002 |
| JP | 2020036002 A | 3/2020 |
| JP | 2021089924 A | 6/2021 |

OTHER PUBLICATIONS

International Search Report in PCT/JP2022/015950, mailed Jun. 21, 2022, 3 pages.

* cited by examiner

*Primary Examiner* — Stanley Tso
(74) *Attorney, Agent, or Firm* — ArentFox Schiff LLP

(57) ABSTRACT

An electronic component that includes: an element body; and an insulating film covering an outer surface of the element body. The insulating film has a mix layer and a glass layer. The mix layer has a first glass and powder particles. The glass layer contains a second glass and has a smaller content percentage of the powder particles than the mix layer. The mix layer is on a side of the insulating film closer to the element body when viewed from the glass layer.

12 Claims, 5 Drawing Sheets

ELECTRONIC COMPONENT

CROSS REFERENCE TO RELATED APPLICATIONS

The present application is a continuation of International application No. PCT/JP2022/015950, filed Mar. 30, 2022, which claims priority to Japanese Patent Application No. 2021-099716, filed Jun. 15, 2021, the entire contents of each of which are incorporated herein by reference.

TECHNICAL FIELD

The present invention relates to an electronic component.

BACKGROUND ART

An electronic component disclosed in Patent Document 1 includes an element body and an insulating film covering an outer surface of the element body. The insulating film is a glass layer made of glass.
Patent Document 1: Japanese Unexamined Patent Application Publication No. 2002-043167

SUMMARY OF THE INVENTION

There may be instances where impact from outside is applied to the electronic component disclosed in Patent Document 1. Upon impact from outside against the electronic component, the load applied by the impact and the internal stress in the glass layer may combine, and a large force may act on a particular site of the glass layer. When a large force acts on the glass layer, there is a possibility of delamination of a portion of the glass layer from the outer surface of the element body.

To address the issues described above, the present description provides an electronic component that includes an element body and an insulating film covering an outer surface of the element body. The insulating film includes a mix layer that contains a first glass and powder particles, and a glass layer that contains a second glass and has a smaller content percentage of the powder particles than the mix layer, and the mix layer is on a side of the insulating film closer to the element body when viewed from the glass layer.

According to the above-described structure, the insulating film has a mix layer and a glass layer. The mix layer contains glass and powder particles. Compared to the glass layer, the mix layer has a large powder particle content percentage, and thus the internal stress in the glass is moderated correspondingly. Moreover, at the sites where the powder particles are present, the internal stress in the glass is divided up between the powder particles, and thus a large internal stress is less likely to concentrate and act on a particular site. Thus, when impact from outside is applied to the electronic component, delamination of the insulating film from the element body caused by the internal stress can be suppressed.

Delamination of the insulating film from the element body can be suppressed.

DETAILED DESCRIPTION OF THE PREFERRED EMBODIMENTS

Figure 1:
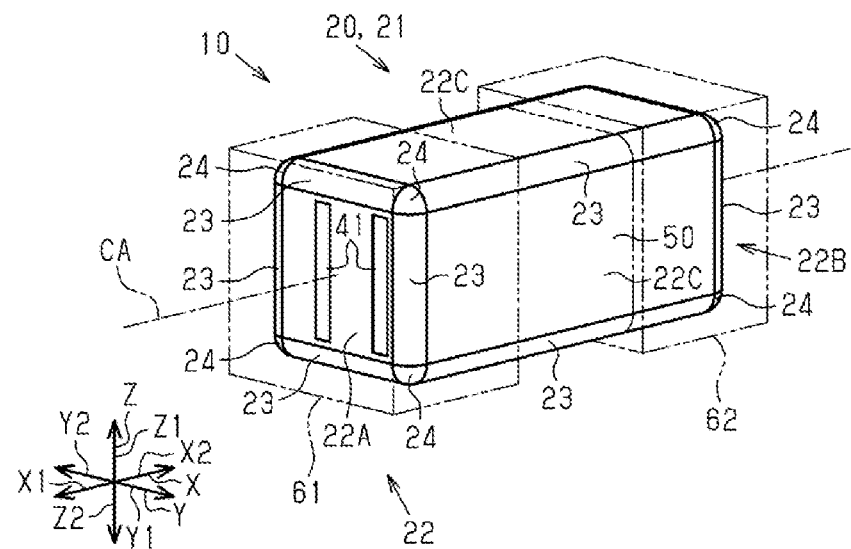
FIG. 1 is a perspective view of an electronic component.

<One Embodiment of Electronic Component>
One embodiment of the electronic component will now be described with reference to the drawings. Note that the constituent elements are sometimes enlarged in the drawings to promote understanding. The dimensional ratio of the constituent elements may be different from the actual dimensional ratio or may be different from one drawing to another. Furthermore, although hatching is provided in a cross-sectional view, some constituent elements may be illustrated without hatching to promote understanding.
(Overall Structure)
As illustrated in FIG. 1, an electronic component 10 is, for example, a surface mounting type negative temperature coefficient thermistor component to be mounted onto a circuit board or the like. Here, a negative temperature coefficient thermistor component has characteristics that the resistance value decreases with the increasing temperature.

The electronic component 10 includes an element body 20. The element body 20 is substantially quadratic prism-shaped and has a center axis CA. In the description below, an axis that extends along the center axis CA is referred to as a first axis X. One of axes orthogonal to the first axis X is referred to as a second axis Y. An axis orthogonal to the first axis X and the second axis Y is referred to as a third axis Z. One direction along the first axis X is referred to as a first positive direction X1, and a direction that runs along the first axis X but opposite to the first positive direction X1 is referred to as a first negative direction X2. One direction along the second axis Y is referred to as a second positive direction Y1, and a direction that runs along the second axis Y but opposite to the second positive direction Y1 is referred to as a second negative direction Y2. One direction along the third axis Z is referred to as a third positive direction Z1, and a direction that runs along the third axis Z but opposite to the third positive direction Z1 is referred to as a third negative direction Z2.

An outer surface 21 of the element body 20 has six flat surfaces 22. The six flat surfaces 22 each spread in different directions. The six flat surfaces 22 can be roughly classified into a first end surface 22A facing in the first positive direction X1, a second end surface 22B facing in the first negative direction X2, and four side surfaces 22C. The four side surfaces 22C are a surface facing in the third positive direction Z1, a surface facing in the third negative direction Z2, a surface facing in the second positive direction Y1, and a surface facing in the second negative direction Y2.

The outer surface 21 of the element body 20 has twelve boundary surfaces 23. The boundary surfaces 23 include curved surfaces at boundaries between adjacent flat surfaces 22. In other words, the boundary surfaces 23 include curved surfaces formed by R-chamfering corners formed between adjacent flat surfaces 22.

The outer surface 21 of the element body 20 also has eight spherical corner surfaces 24. The corner surfaces 24 are each a boundary portion among adjacent three flat surfaces 22. In other words, the corner surfaces 24 include curved surfaces at sites where three boundary surfaces 23 meet. In other words, the corner surfaces 24 include, for example, curved surfaces formed by R-chamfering corners formed between adjacent three flat surfaces 22.

Figure 2:
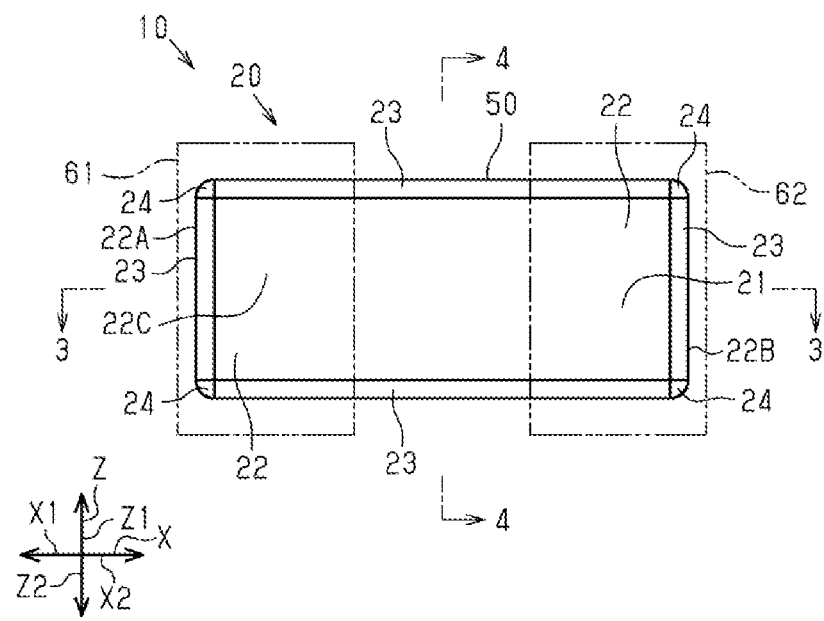
FIG. 2 is a side view of the electronic component.

In FIGS. 1 and 2, reference signs are assigned by deeming the surface of an insulating film 50 described below to be the same as the outer surface 21 of the element body 20.

As illustrated in FIG. 2, in the element body 20, the dimension in the direction along the first axis X is larger than the dimension in the direction along the third axis Z. As illustrated in FIG. 1, in the element body 20, the dimension in the direction along the first axis X is larger than the dimension in the direction along the second axis Y. The material of the element body 20 is a ceramic obtained by firing a metal oxide containing at least one element selected from Mn, Fe, Ni, Co, Ti, Ba, Al, and Zn.

Figure 3:
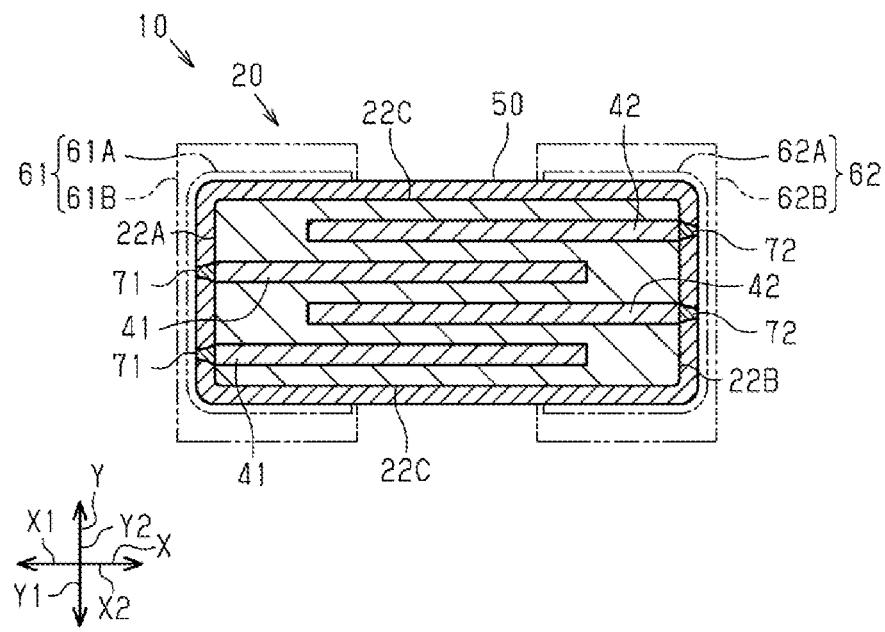
FIG. 3 is a cross-sectional view taken along line 3-3 in FIG. 2.

As illustrated in FIG. 3, the electronic component 10 includes two first inner electrodes 41 and two second inner electrodes 42. The first inner electrodes 41 and the second inner electrodes 42 are embedded in the element body 20.

The material of the first inner electrodes 41 is an electrically conductive material. For example, the material of the first inner electrodes 41 is palladium. The material of the second inner electrodes 42 is the same as the material of the first inner electrodes 41.

The shape of the first inner electrodes 41 is a rectangular plate shape. The main surfaces of the first inner electrodes 41 are orthogonal to the second axis Y. The shape of the second inner electrodes 42 is the same rectangular plate shape as the first inner electrodes 41. The main surfaces of the second inner electrodes 42 are orthogonal to the second axis Y as with the first inner electrodes 41.

The dimension of the first inner electrodes 41 in the direction along the first axis X is smaller than the dimension of the element body 20 in the direction along the first axis X. As illustrated in FIG. 1, the dimension of the first inner electrodes 41 in the direction along the third axis Z is about two thirds of the dimension of the element body 20 in the direction along the third axis Z. The dimensions of the second inner electrodes 42 in the respective directions are the same as the dimensions of the first inner electrodes 41.

As illustrated in FIG. 3, the first inner electrodes 41 and the second inner electrodes 42 are arranged alternately in the direction along the second axis Y. That is, from the side surface 22C facing in the second positive direction Y1, a first inner electrode 41, a second inner electrode 42, a first inner electrode 41, and a second inner electrode 42 are arranged in this order in the second negative direction Y2. In this embodiment, the distance between the inner electrodes in the direction along the second axis Y is the same.

As illustrated in FIG. 1, the two first inner electrodes 41 and the two second inner electrodes 42 are at the center of the element body 20 in the direction along the third axis Z. In contrast, as illustrated in FIG. 3, the first inner electrodes 41 are lopsided in the first positive direction X1. The second inner electrodes 42 are lopsided in the first negative direction X2.

Specifically, the first positive direction X1-side ends of the first inner electrodes 41 coincide with the first positive direction X1-side end of the element body 20. The first negative direction X2-side ends of the first inner electrodes 41 are located inside the element body 20 and fall short of reaching the first negative direction X2-side end of the element body 20. Meanwhile, the first negative direction X2-side ends of the second inner electrodes 42 coincide with the first negative direction X2-side end of the element body 20. The first positive direction X1-side ends of the second inner electrodes 42 are located inside the element body 20 and fall short of reaching the first positive direction X1-side end of the element body 20.

The electronic component 10 includes an insulating film 50. The insulating film 50 covers the outer surface 21 of the element body 20. In this embodiment, the insulating film covers all parts of the outer surface 21 of the element body 20.

As illustrated in FIG. 3, the electronic component 10 includes a first outer electrode 61 and a second outer electrode 62. The first outer electrode 61 includes a first base electrode 61A and a first metal layer 61B. The first base electrode 61A is formed on the insulating film 50 in one portion of the outer surface 21 of the element body 20, the one portion including the first end surface 22A. Specifically, the first base electrode 61A is a five-surface electrode that covers the first end surface 22A of the element body 20 and a first positive direction X1-side portion of each of the four side surfaces 22C. In this embodiment, the material of the first base electrode 61A is silver and glass.

The first metal layer 61B covers the first base electrode 61A from the outside. Thus, the first metal layer 61B is stacked on the first base electrode 61A. Specifically, the first metal layer 61B has a two layer structure including a nickel plating and a tin plating.

The second outer electrode 62 includes a second base electrode 62A and a second metal layer 62B. The second base electrode 62A is formed on the insulating film 50 in one portion of the outer surface 21 of the element body 20, the one portion including the second end surface 22B.

Specifically, the second base electrode 62A is a five-surface electrode that covers the second end surface 22B of the element body 20 and a first negative direction X2-side portion of each of the four side surfaces 22C. In this embodiment, the material of the second base electrode 62A is silver and glass as with the material of the first outer electrode 61.

The second metal layer 62B covers the second base electrode 62A from the outside. Thus, the second metal layer 62B is stacked on the second base electrode 62A. Specifically, the second metal layer 62B has a two layer structure including a nickel plating and a tin plating as with the first metal layer 61B.

The second outer electrode 62 on the side surfaces 22C falls short of reaching the first outer electrode 61 and is separated from the first outer electrode 61 in the direction along the first axis X. In addition, center portions of the respective side surfaces 22C of the element body 20 in the direction along the first axis X have neither the first outer electrode 61 nor the second outer electrode 62 stacked thereon, and the insulating film 50 is exposed. Here, in FIGS. 1 to 3, the first outer electrode 61 and the second outer electrode 62 are indicated by double-dashed chain lines.

As illustrated in FIG. 3, the first outer electrode 61 and the first positive direction X1-side ends of the first inner electrodes 41 are connected via first penetrating portions 71 penetrating through the insulating film 50. Although the detailed descriptions therefor are described below, the first penetrating portions 71 are formed as palladium constituting the first inner electrodes 41 extends toward the first outer electrode 61 during the process of producing the electronic component 10.

Moreover, the second outer electrode 62 and the first negative direction X2-side ends of the second inner electrodes 42 are connected via second penetrating portions 72 penetrating through the insulating film 50. As with the first penetrating portions 71, the second penetrating portions 72 are also formed as palladium constituting the first inner electrodes 41 extends toward the second outer electrode 62 during the process of producing the electronic component 10. Note that, in FIG. 3, the first inner electrodes 41 and the first penetrating portions 71 are illustrated as separate members having boundaries; however, there are no clear boundaries between the two in actual cases. The same applies to the second penetrating portions 72. Furthermore, in FIGS. 1 and 2, the illustration of the first penetrating portions 71 is omitted.

(Insulating Film)

Figure 4:
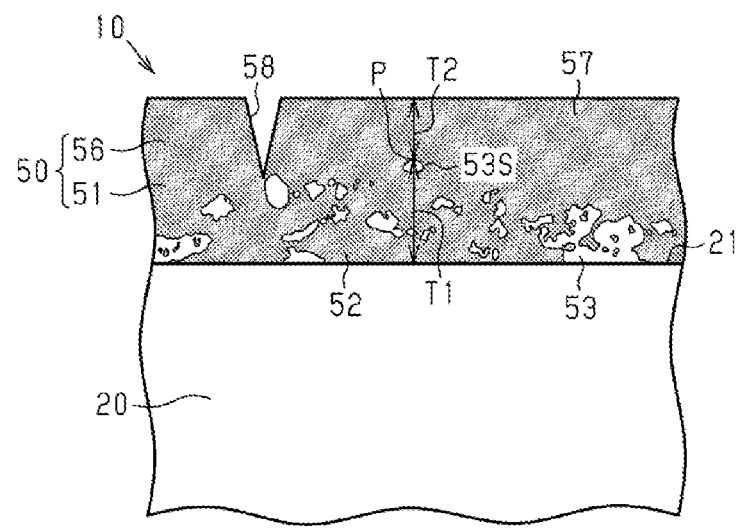
FIG. 4 is an enlarged view of a cross section taken along line 4-4 in FIG. 2.

As illustrated in FIG. 4, the insulating film 50 has a mix layer 51 and a glass layer 56. The mix layer 51 contains glass 52 and powder particles 53. The mix layer 51 is stacked on the outer surface 21 of the element body 20. In other words, the mix layer 51 directly covers the outer surface 21 of the element body 20 without other layers interposed therebetween. In addition, the mix layer 51 is on a side closer to the element body 20 when viewed from the glass layer 56.

In a cross-sectional view of the mix layer 51, the powder particles 53 are dispersed in the glass 52. The material of the powder particles 53 is the same as the material of the element body 20. Moreover, the thermal expansion coefficient of the powder particles 53 is larger than the thermal expansion coefficient of the glass 52. The average particle diameter of the powder particles 53 is 100 nm or more. Here, the average particle diameter may be calculated as the average value of particle diameters of randomly extracted multiple, for example, ten, powder particles 53 in one image of a cross section. The powder particles 53 may include multiple particles aggregated to form one lump. In such a case, as long as the interfaces of the particles can be observed inside the aggregated lump, a portion surrounded by the boundaries thereof constitutes one powder particle 53. A particle diameter is the largest dimension of a line passing the geometric center of one powder particle 53 when this powder particle 53 is viewed in a cross section.

The glass layer 56 is a layer in which the powder particle 53 content percentage is smaller than in the mix layer 51. In this embodiment, the glass layer 56 is substantially solely composed of glass 57. Note that the glass 57 in the glass layer 56 is integrated with the glass 52 in the mix layer 51, and there is no clear boundary.

The glass layer 56 has a crack 58. The crack 58 opens to a surface of the glass layer 56 opposite from the mix layer 51. The crack 58 does not reach the element body 20. The tip of the crack 58 is inside the mix layer 51. Thus, the powder particles 53 are present in the vicinity of the tip of the crack 58. As mentioned above, the glass 52 and the powder particles 53 are present in the mix layer 51. Moreover, the thermal expansion coefficient of the powder particles 53 is larger than the thermal expansion coefficient of the glass 52. Thus, when the mix layer 51 is heated, the glass 52 in the vicinity of the powder particles 53 is subjected to a force from the expanding powder particles 53. Due to this force, the crack 58 is generated in the insulating film 50, in particular, in the glass 52 in the vicinity of the powder particles 53.

In a cross-sectional view orthogonal to the outer surface 21 of the element body 20, a powder particle 53 farthest from the outer surface 21 of the element body 20 is designated as a specified powder particle 53S. Moreover, in the specified powder particle 53S, a point farthest from the outer surface 21 of the element body 20 is designated as a specified point P. Furthermore, the shortest distance from the outer surface 21 of the element body 20 to the specified point P is designated as a first thickness T1. The shortest distance from the specified point P to the surface of the glass layer 56 covering that powder particle 53 is designated as a second thickness T2. Here, the first thickness T1 is larger than the second thickness T2.

<Embodiment of Method for Producing Electronic Component>

(Overall Structure)

Next, a method for producing the electronic component is described.

Figure 5:
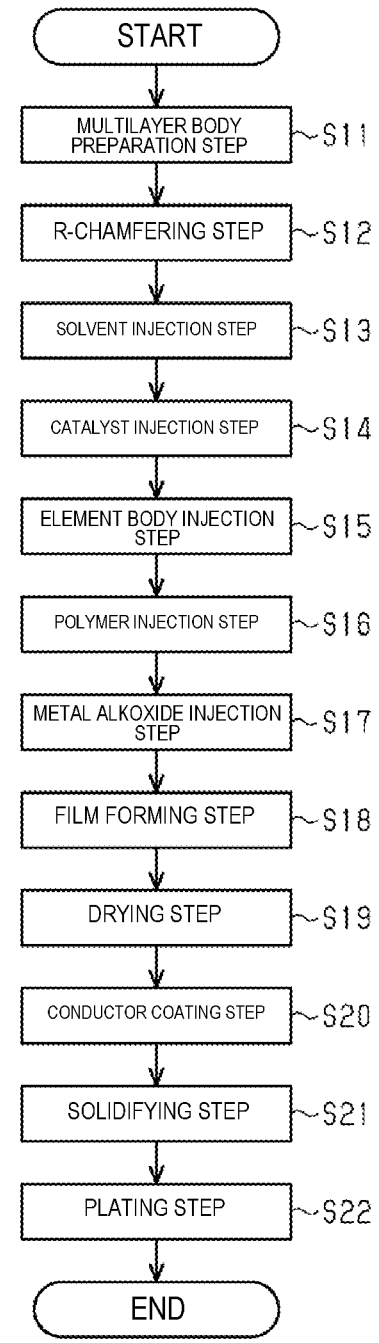
FIG. 5 is a diagram illustrating a method for producing an electronic component.

As illustrated in FIG. 5, the method for producing the electronic component 10 includes a multilayer body preparation step S11, an R-chamfering step S12, a solvent injection step S13, a catalyst injection step S14, an element body injection step S15, a polymer injection step S16, and a metal alkoxide injection step S17. The method for producing the electronic component 10 further includes a film forming step S18, a drying step S19, a conductor applying step S20, a solidifying step S21, and a plating step S22.

First, in forming the element body 20, in the multilayer body preparation step S11, a multilayer body, which is an element body 20 not having boundary surfaces 23 or corner surfaces 24, is prepared. In other words, the multilayer body is a rectangular parallelepiped body having six flat surfaces 22 in a state before the R-chamfering. For example, multiple ceramic sheets that form the element body 20 are prepared first. The sheets have a thin sheet shape. A conductive paste that forms a first inner electrode 41 is stacked onto the sheet. Then a ceramic sheet that forms the element body 20 is stacked on the conductive paste. Then a conductive paste that forms a second inner electrode 42 is stacked onto the sheet. As such, the ceramic sheets and the conductive paste are stacked. The resulting stack is cut into a particular size to form a green multilayer body. The green multilayer body is then fired at a high temperature to prepare a multilayer body.

Next, the R-chamfering step S12 is performed. In the R-chamfering step S12, boundary surfaces 23 and corner surfaces 24 are formed on the multilayer body prepared in the multilayer body preparation step S11. For example, by R-chamfering the corners of the multilayer body by barrel polishing, the boundary surfaces 23 that have curved surfaces and the corner surfaces 24 that have curved surfaces are formed. As a result, an element body 20 is formed. A portion of the ceramic sheets that have constituted the multilayer body attaches to the outer surface 21 of the element body 20 as the powder particles 53. Thus, the material of the powder particles 53 is the same as the material of the element body 20.

Figure 6:
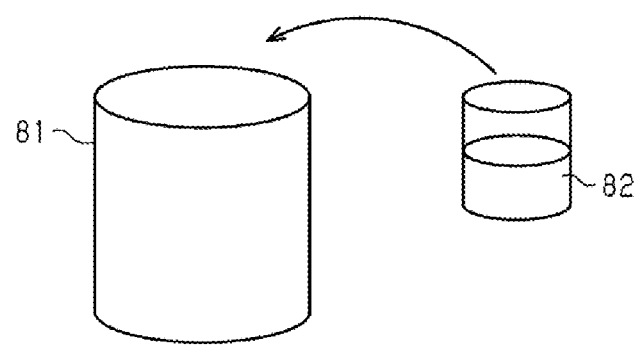
FIG. 6 is a diagram illustrating the method for producing an electronic component.

Next, the solvent injection step S13 is performed. As illustrated in FIG. 6, in the solvent injection step S13, 2-propanol is injected as a solvent 82 into a reactor 81.

Figure 7:
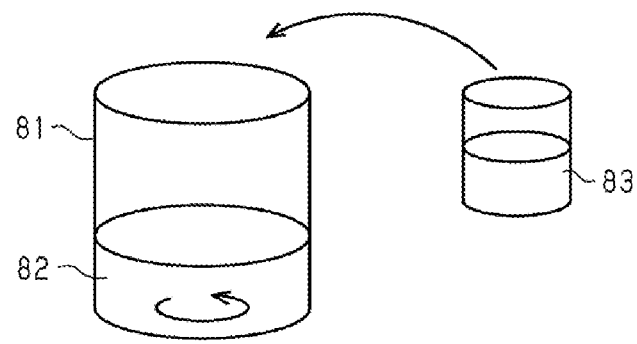
FIG. 7 is a diagram illustrating the method for producing an electronic component.

Next, as illustrated in FIG. 5, the catalyst injection step S14 is performed. As illustrated in FIG. 7, in the catalyst injection step S14, first, stirring of the solvent 82 in the reactor 81 is started. Next, ammonia water is injected as a catalyst-containing aqueous solution 83 into the reactor 81. The catalyst in this embodiment is a hydroxide ion which serves as a catalyst that accelerates the hydrolysis of a metal alkoxide 85 described below.

Figure 8:
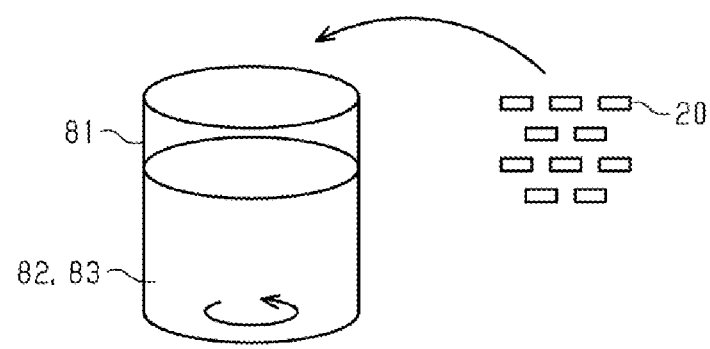
FIG. 8 is a diagram illustrating the method for producing an electronic component.

Next, as illustrated in FIG. 5, the element body injection step S15 is performed. As illustrated in FIG. 8, in the element body injection step S15, multiple element bodies 20, which have been formed in the R-chamfering step S12 as described above, are injected into the reactor 81.

Figure 9:
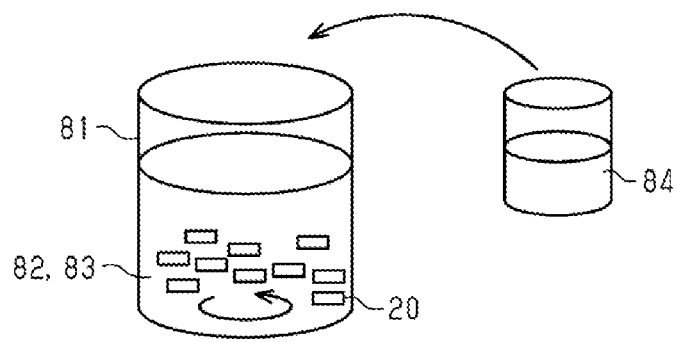
FIG. 9 is a diagram illustrating the method for producing an electronic component.

Next, as illustrated in FIG. 5, the polymer injection step S16 is performed. As illustrated in FIG. 9, in the polymer injection step S16, polyvinylpyrrolidone is injected as a polymer 84 into the reactor 81. As a result, the polymer 84 injected into the reactor 81 adsorb onto the outer surfaces 21 of the element bodies 20.

Figure 10:
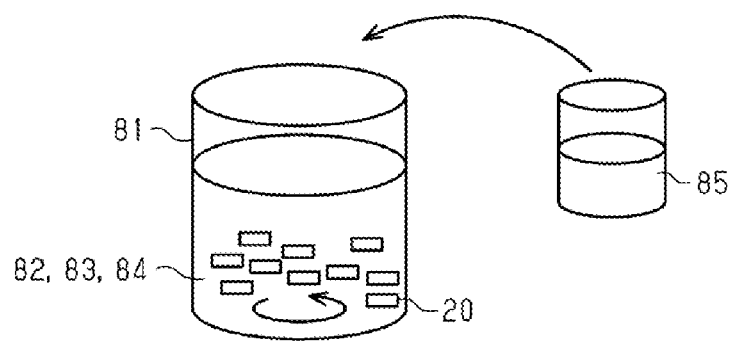
FIG. 10 is a diagram illustrating the method for producing an electronic component.

Next, as illustrated in FIG. 5, the metal alkoxide injection step S17 is performed. As illustrated in FIG. 10, in the metal alkoxide injection step S17, liquid tetraethyl orthosilicate is injected as the metal alkoxide 85 into the reactor 81. Here, tetraethyl orthotetrasilicate is also called tetraethoxysilane. In this embodiment, the amount of the metal alkoxide 85 injected in the metal alkoxide injection step S17 is calculated on the basis of the area of the outer surfaces 21 of the element bodies 20 injected in the element body injection step S15. Specifically, the amount is calculated by multiplying the amount of the metal alkoxide 85 necessary for forming an insulating film 50 covering the outer surface 21 of one element body 20 with the number of the element bodies 20.

Next, as illustrated in FIG. 5, the film forming step S18 is performed. In the film forming step S18, stirring of the solvent 82 started in the aforementioned solvent injection step S13 is continued for a predetermined time after the injection of the metal alkoxide 85 into the reactor 81 in the metal alkoxide injection step S17.

Next, the drying step S19 is performed. In the drying step S19, after stirring is continued for a predetermined time in the film forming step S18, the element bodies 20 are discharged from the reactor 81 and dried. As a result, the sol-state insulating films 50 are dried and form gel-state insulating films 50. During this process, the glass 52 grows so as to cover the powder particles 53 attached to the outer surface 21 of the element body 20. As a result, an insulating film 50 that has a mix layer 51 and a glass layer 56 is formed. Here, in this embodiment, the solvent injection step S13, the catalyst injection step S14, the element body injection step S15, the polymer injection step S16, the metal alkoxide injection step S17, and the film forming step S18 constitute the method for forming an insulating film 50 on an element body 20.

Next, the conductor applying step S20 is performed. In the conductor applying step S20, a conductor paste is applied to two portions of the surface of the insulating film 50, that is, a portion that includes a portion that covers the first end surface 22A of the element body 20 and a portion that includes a portion that covers the second end surface 22B of the element body 20. Specifically, the conductor paste is applied so as to cover the insulating film 50 on the entire first end surface 22A and one portion of each of the four side surfaces 22C. Furthermore, the conductor paste is applied so as to cover the insulating film 50 on the entire second end surface 22B and one portion of each of the four side surfaces 22C.

Next, the solidifying step S21 is performed. Specifically, the solidifying step S21 involves heating the insulating film 50 and the element body 20 onto which the conductor paste is applied. As a result, water and the polymer 84 evaporate from the gel-state insulating film 50, and, thus, as illustrated in FIG. 3, the insulating film 50 covering the outer surface 21 of the element body 20 is fired and solidified. As a result, the first base electrode 61A and the second base electrode 62A are formed as a result of firing the conductor paste applied in the conductor applying step S20. As such, the conductor applying step S20 and the solidifying step S21 constitute a base electrode forming step. In other words, the solidifying step S21 of this embodiment serves not only as the step for solidifying the insulating film 50 but also as a part of the base electrode forming step.

In this embodiment, during heating performed in the solidifying step S21, palladium contained in the first inner electrodes 41 is drawn toward the silver-containing first base electrode 61A due to the Kirkendall effect caused by the difference in the diffusion speed between the first inner electrodes 41 and the first base electrode 61A. As a result, the first penetrating portions 71 penetrate through the insulating film 50 and extend from the first inner electrodes 41 to the first base electrode 61A, and thus the first inner electrodes 41 become connected to the first base electrode 61A. This same applies to the second penetrating portions 72 that connect the second inner electrodes 42 and the second base electrode 62A.

Next, the plating step S22 is performed. Electroplating is performed on the first base electrode 61A and the second base electrode 62A. As a result, a first metal layer 61B is formed on the surface of the first base electrode 61A. Furthermore, a second metal layer 62B is formed on the surface of the second base electrode 62A. Although not illustrated in the drawings, the first metal layer 61B and the second metal layer 62B are each electro-plated with two metals, nickel and tin, and thus have a two-layer structure. As a result, an electronic component 10 is formed.

(Mechanism of Embodiments)

Suppose the insulating film 50 is made solely of glass 57. In such a case, the internal stresses at respective sites of the glass 57 may combine, and large internal stress may be generated at a particular site. Thus, when impact is applied from outside, the outside impact and the internal stress become superposed, and the glass 57 is induced to deform. As a result, cracks may propagate in the glass 57, or the glass 57 may curve in the thickness direction, resulting in delamination of the glass 57 from the outer surface 21 of the element body 20.

(Effects of Embodiments)

(1) According to the embodiment described above, the insulating film 50 includes a mix layer 51 and a glass layer 56. The mix layer 51 contains glass 52 and powder particles 53. Thus, compared to the glass layer 56, the mix layer 51 has a large powder particle 53 content percentage, and thus the internal stress of the glass 52 is moderated correspondingly. Moreover, in the sites where the powder particles 53 are present, minute gaps are likely to be generated. Specifically, minute gaps are generated between the particles in the powder particles 53 and between the powder particles 53 and the glass 52, and this generates sites where the adhesion is low compared to the adhesion among the glass 52. These minute gaps divide up the internal stress in the glass 52 between individual powder particles 53 at the sites where the powder particles 53 are present, and thus a large internal stress is less likely to concentrate and act on a particular site. Thus, when impact from outside is applied to the electronic component 10, delamination of the insulating film 50 from the element body 20 caused by the internal stress can be suppressed.

(2) If, in the production process, the first metal layer 61B and the second metal layer 62B are formed while the insulating film 50 is delaminated from the outer surface 21 of the element body 20, the plating solution used to form the first metal layer 61B and the second metal layer 62B penetrates into the sites where the insulating film 50 is delaminated. As a result, the element body 20 may dissolve in the plating solution. In this embodiment, the insulating film 50 covers the entirety of the outer surface 21 of the element body 20. Thus, the contact between the element body 20 and the plating solution is prevented, and the element body 20 is prevented from dissolving in the plating solution in the plating step S22.

(3) According to the embodiment described above, the material of the powder particles 53 is the same as the material of the element body 20. Thus, there is no need to prepare a special material for the powder particles 53. In addition, in the embodiment described above, a portion of the ceramic sheets generated during the R-chamfering step S12 is directly utilized as the powder particles 53. Thus, there is no need to add a process of incorporating powder particles 53 into the insulating film 50.

(4) According to the embodiment described above, the powder particles 53 have an average particle diameter of 100 nm or more. Thus, in the mix layer 51, a sufficient area can be secured as the area of the boundary between one particle powder particle 53 and the glass 52. Thus, a situation where the average particle diameter of the powder particles 53 is too small to sufficiently divide the internal stress at the boundaries between the powder particles 53 and the glass 52 rarely occurs.

(5) The first thickness Ti corresponds to the thickness of the mix layer 51. The second thickness T2 corresponds to the thickness of the glass layer 56. In other words, according to the embodiment described above, the thickness of the mix layer 51 is larger than the thickness of the glass layer 56. As such, since the mix layer 51 accounts for a larger fraction of the insulating film 50, delamination of the insulating film 50 from the outer surface 21 of the element body 20 is less likely to occur.

(6) According to the embodiment described above, the insulating film 50 has a crack 58. The crack 58 opens to a surface of the glass layer 56 opposite from the mix layer 51. The internal stress in the insulating film 50 becomes combined while avoiding the inner space of the crack 58. Thus, compared to the case where no crack 58 is present, the internal stress in the insulating film 50 does not smoothly combine. Moreover, when a new crack is generated due to impact from outside, propagation of this crack is obstructed by the existing crack 58. Thus, a large crack that could cause delamination of the insulating film 50 is less likely to occur. Note that the crack 58 does not reach the element body 20. Thus, there is a low possibility that the crack 58 would directly cause delamination of the insulating film 50.

(7) According to the embodiment described above, the material of the element body 20 is a ceramic. Furthermore, the mix layer 51 directly covers the outer surface 21 of the element body 20 without other layers interposed therebetween. As a result, when the mix layer 51 is viewed in a direction orthogonal to the outer surface 21, it is highly possible that the powder particles 53 would be situated to cover the grain boundaries between the grains of the element body 20. Thus, when impact is applied from outside the insulating film 50 and a new crack propagates in the insulating film 50, the powder particles 53 prevent propagation of the new crack, and thus propagation of the new crack up to the grain boundaries of the element body 20 can be suppressed. If propagation of the new crack up to the grain boundaries of the element body 20 can be suppressed, the new crack in the insulating film 50 can be prevented from propagating along the grain boundaries of the element body 20.

<Other Embodiments>

The embodiments described above can be implemented with the following modifications and alterations. The aforementioned embodiments and the modification examples described below can be combined and implemented unless there is technical inconsistencies.

In the aforementioned embodiment, the electronic component 10 is not limited to the negative temperature coefficient thermistor component. For example, it may be a thermistor component that is not of a negative temperature coefficient type, a multilayer capacitor component, or an inductor component.

The material of the element body 20 is not limited to the examples described in the embodiment above. For example, the material of the element body 20 may be a composite body of a resin and a metal powder.

The shape of the element body 20 is not limited to the examples described in the embodiment above. For example, the element body 20 may have a polygonal prismatic shape other than the rectangular prismatic shape having the center axis CA. Moreover, the element body 20 may be a core of a winding inductor component. For example, the core may have a so-called a drum core shape. Specifically, the core may have a columnar winding core portion and flanges respectively disposed at end portions of the winding core portion.

The outer surface 21 of the element body 20 does not have to have corner surfaces 24 including curved surfaces. For example, when boundaries of the adjacent flat surfaces 22 of the outer surface 21 of the element body 20 are not chamfered, there are no curved surfaces at these boundaries. Thus, at a site where three of such boundaries meet, there may be no corner surface 24 that includes a curved surface.

The powder particles 53 may be derived from not only the ceramic sheets constituting the multilayer body, but also an abrasive used to polish the multilayer body. In the example illustrated in FIG. 11, the element body 20 has a minute recess 26. The inner surface of the recess 26 is inwardly recessed with respect to the outer surface 21 of the element body 20. The recess 26 is formed as the ceramic particles fall off from the element body 20 in the R-chamfering step S12, and remains in the element body 20 when subsequent polishing is not sufficient. In the example illustrated in FIG. 11, abrasive particles 53B of the abrasive used in the R-chamfering step S12 are present in the inner space of the recess 26. A portion of the one abrasive particle 53B sticks into the element body 20 and is fixed. In such a case, the abrasive particles 53B that remain in the inner space of the recess 26 function as the powder particles 53. The material of the abrasive particles 53B is, for example, alumina or zirconia.

Figure 11:
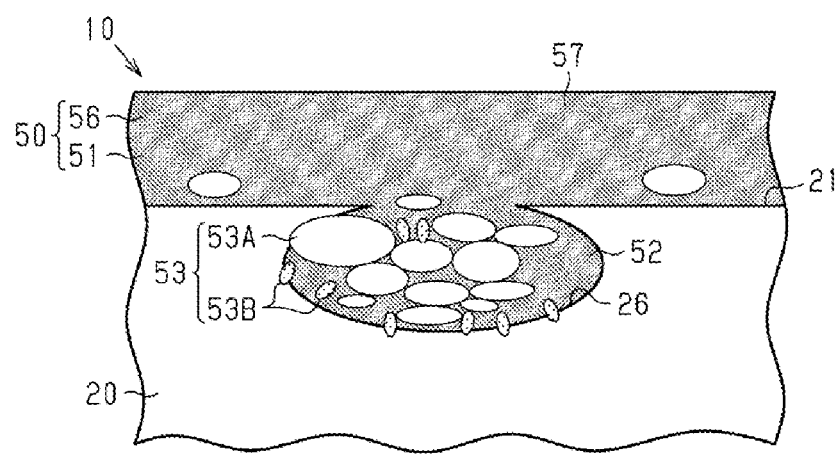
FIG. 11 is an enlarged view of a cross section of an electronic component of a modification example.

In the example illustrated in FIG. 11, when viewed in a direction orthogonal to the outer surface 21, the recess 26 has an opening in the outer surface 21, and this opening is smaller than the maximum range of the inner space. Thus, element body-derived particles 53A which are part of the element body 20 polished in the R-chamfering step S12 serve as powder particles 53 and are present in the inner space of the recess 26. As such, when the element body 20 has a recess 26, it becomes easy to have many element body-derived particles 53A present in the inner space of the recess 26. This is preferable for formation of the mix layer 51. It should be noted that the shape of the recess 26 illustrated in FIG. 11 is simplified, and there may be recesses 26 of various shapes in the element body 20.

In the example illustrated in FIG. 11, the abrasive particles 53B stick into the element body 20 and are fixed; however, there may be cases in which the abrasive particles 53B are attached to the surface of the element body 20 by an electrostatic attractive force, or these two types of the abrasive particles 53B may both be present.

In the embodiment described above, the material of the powder particles 53 need not be the same as the element body 20 or the abrasive. For example, powder particles 53 may be preliminarily mixed into a coating solution. The thermal expansion coefficient of the powder particles 53 is to be larger than the thermal expansion coefficient of the glass 52, and, for this, may be $0.6 \times 10^{-6}$ to $15 \times 10^{-6}$ (/K).

In the embodiment described above, the powder particles 53 may have an average particle diameter of 100 nm or less. In this case, the powder particles 53 may be aggregated or scattered. The smaller the average particle diameter of the powder particles 53, the more likely the powder particles 53 would aggregate with one another.

In the embodiment described above, the shape of the first inner electrodes 41 and the second inner electrodes 42 may be any shape as long as electrical conduction between the corresponding first outer electrode 61 and second outer electrode 62 can be secured. The number of the first inner electrodes 41 and the second inner electrodes 42 may be any, and the number of the first inner electrodes 41 may be 1 or may be 3 or more.

The structure of the first outer electrode 61 is not limited to the example of the embodiment described above. For example, the first outer electrode 61 may be solely constituted by the first base electrode 61A, and the first metal layer 61B does not have to have a two-layer structure. Note that, when the first outer electrode 61 includes the first metal layer 61B, the insulating film 50 covers the entirety of the outer surface 21 of the element body 20, and thus an effect of suppressing dissolution of the element body 20 in the plating solution can be obtained. The same applies to the second outer electrode 62.

In the embodiment described above, the combination of the materials of the first inner electrodes 41 and the first base electrode 61A is not limited to the combination of palladium and silver. For example, the combination may be copper and nickel, copper and silver, silver and gold, nickel and cobalt, or nickel and gold. Alternatively, for example, the one may be silver and the other may be a combination of silver and palladium. Alternatively, for example, the one may be palladium and the other may be a combination of silver and palladium, or the one may be copper and the other may be a combination of silver and palladium. Alternatively, for example, the one may be gold and the other may be a combination of silver and palladium.

It should be noted that, depending on the combination of the first inner electrodes 41 and the first base electrode 61A, the Kirkendall effect does not always occur. In such a case, for example, a portion of the insulating film 50 may be physically removed by polishing the first end surface 22A-side of the element body 20 to expose the first inner electrodes 41 prior to the outer electrode forming step. The first inner electrodes 41 can be connected to the first base electrode 61A by subsequently performing the base electrode forming step. In addition, for example, after formation of the first base electrode 61A, an insulating film 50 may be formed also on the surface of the first base electrode 61A and then the insulating film 50 covering the surface of the first base electrode 61A may be removed. The same applies to the combination of the materials of the second inner electrodes 42 and the second base electrode 62A.

The site where the first outer electrode 61 is disposed is not limited to the example of the embodiment described above. For example, the first outer electrode 61 may be disposed on the first end surface 22A and one of the side surfaces 22C. The same applies to the second outer electrode 62.

Regarding the insulating film 50, the glass layer 56 may contain powder particles 53. At the least, the powder particle 53 content percentage in the glass layer 56 is to be smaller than the powder particle 53 content percentage in the mix layer 51.

The first thickness T1 may be smaller than or equal to the second thickness T2. The insulating film 50 is to have a mix layer 51 and a glass layer 56. The boundary between the mix layer 51 and the glass layer 56 does not have to be clear, and, as long as the powder particles 53 content percentage is larger in the surface-side portion of the insulating film 50 than in the element body 20—side portion of the insulating film 50, it can be said that the insulating film 50 has a mix layer 51 and a glass layer 56.

The position of the crack 58 in the insulating film 50 is not limited to the examples described in the embodiment above. Alternatively, there may be no crack 58 in the insulating film 50. Yet alternatively, there may be more than one cracks 58.

The insulating film 50 does not have to cover all parts of the outer surface 21 of the element body 20. In other words, some portion of the outer surface 21 of the element body 20 may be exposed from the insulating film 50. The range to be covered by the insulating film 50 may be modified as appropriate according to the shape of the element body 20, the positions of the first outer electrode 61 and the second outer electrode 62, etc.

In the portion of the insulating film 50 covered by the first base electrode 61A, the glass 52 in the insulating film 50 may diffuse into the glass in the first base electrode 61A, thereby integrating the insulating film 50 and the first base electrode 61A.

The mix layer 51 does not have to directly cover the outer surface 21 of the element body 20. For example, another layer may be interposed between the mix layer 51 and the outer surface 21. In such a case also, delamination of the insulating film 50 from another layer can be suppressed as long as the mix layer 51 is on a side closer to the element body 20 when viewed from the glass layer 56. As a result, delamination of the insulating film 50 from the outer surface 21 of the element body 20 can be suppressed.

The material of the insulating film 50 is not limited to the examples described in the embodiment above. For example, the glass 52 and the glass 57 are not limited to silicon dioxide, and may be Si-containing multicomponent oxide such as oxides based on B—Si, Si—Zn, Zr—Si, and Al—Si. Furthermore, the glass 52 and the glass 57 may be a multicomponent oxide containing an alkali metal and Si, such as oxides based on Al—Si, Na—Si, K—Si, and Li—Si. Furthermore, the glass 52 and the glass 57 may be a multicomponent oxide containing an alkaline earth metal and Si, such as oxides based on Mg—Si, Ca—Si, Ba—Si, and Sr—Si. Moreover, the glass 52 and the glass 57 may be free of Si or a mixture of any of the foregoing.

The material of the insulating film 50 may contain, in addition to the glass 52 and the glass 57, a surface treatment agent or an antistatic agent such as a pigment, a silicone flame retardant, a silane coupling agent, or a titanate coupling agent.

More specifically, the insulating film 50 may contain, in addition to the glass 52, the glass 57, and the powder particles 53, an organic acid salt, an oxide, an inorganic salt, an organic salt, and an additive of fine particles and nanoparticles of metal oxide.

Examples of the organic acid salt include salts of oxo acids such as soda ash, sodium carbonate, sodium hydrogen carbonate, sodium percarbonate, sodium sulfite, sodium hydrogen sulfite, sodium sulfate, sodium thiosulfate, sodium nitrate, and sodium sulfite, and halogen compounds such as sodium fluoride, sodium chloride, sodium bromide, and sodium iodide.

An example of the oxide is sodium peroxide, and an example of the hydroxide is sodium hydroxide.

Examples of the inorganic salt include sodium hydride, sodium sulfide, sodium hydrogen sulfide, sodium silicate, trisodium phosphate, sodium borate, sodium borohydride, sodium cyanide, sodium cyanate, and sodium tetrachloroaurate.

Examples of the inorganic salt include calcium peroxide, calcium hydroxide, calcium fluoride, calcium chloride, calcium bromide, calcium iodide, calcium hydride, calcium carbide, and calcium phosphide.

The additive may be an oxo acid salt such as calcium carbonate, calcium hydrogen carbonate, calcium nitrate, calcium sulfate, calcium sulfite, calcium silicate, calcium phosphate, calcium pyrophosphate, calcium hypochlorite, calcium chlorate, calcium perchlorate, calcium bromate, calcium iodate, calcium arsenite, calcium chromate, calcium tungstate, calcium molybdate, calcium magnesium carbonate, or hydroxyapatite. Further examples of the additive include calcium acetate, calcium gluconate, calcium citrate, calcium malate, calcium lactate, calcium benzoate, calcium stearate, and calcium aspartate.

For example, the additive may be lithium carbonate, lithium chloride, lithium titanate, lithium nitride, lithium peroxide, lithium citrate, lithium fluoride, lithium hexafluorophosphate, lithium acetate, lithium iodide, lithium hypochlorite, lithium tetraborate, odor lithium hydride, lithium nitrate, lithium hydroxide, lithium aluminum hydride, lithium triethylborohydride, lithium hydride, lithium amide, lithium imide, lithium diisopropylamide, lithium tetramethylpiperidide, lithium sulfide, lithium sulfate, lithium thiophenolate, or lithium phenoxide.

For example, the additive may be boron triiodide, sodium cyanoborohydride, sodium borohydride, tetrafluoroboric acid, triethylborane, borax, or boric acid.

For example, the additive may be potassium arsenide, potassium bromide, potassium carbide, potassium chloride, potassium fluoride, potassium hydride, potassium iodide, potassium triiodide, potassium azide, potassium nitride, potassium superoxide, potassium ozonide, potassium peroxide, potassium phosphide, potassium sulfide, potassium selenide, potassium telluride, potassium tetrafluoroaluminate, potassium tetrafluoroborate, potassium tetrahydroborate, potassium methanide, potassium cyanide, potassium formate, potassium hydrogen fluoride, potassium tet,aiodomercurate(II), potassium hydrogen sulfide, potassium octachlorodimolybdate(II), potassium amide, potassium hydroxide, potassium hexafluorophosphate, potassium carbonate, potassium tetrachlorideplatinate(II), potassium hexachlorideplatinate(IV), potassium nonahydridorhenate(VII), potassium sulfate, potassium acetate, gold(I) potassium cyanide, potassium hexanitritocobaltate(III), potassium hexacyanoferrate(III), potassium hexacyanoferrate(II), potassium methoxide, potassium ethoxide, potassium tert-butoxide, potassium cyanate, potassium fulminate, potassium thiocyanate, aluminum potassium sulfate, potassium aluminate, potassium arsenate, potassium bromate, potassium hypochlorite, potassium chlorite, potassium chlorate, potassium perchlorate, potassium carbonate, potassium chromate, potassium dichromate, potassium tetrakis(peroxo)chromate(V), potassium cuprate(III), potassium ferrate, potassium iodate, potassium periodate, potassium permanganate, potassium manganate, potassium hypomanganate, potassium molybdate, potassium nitrite, potassium nitrate, tripotassium phosphate, potassium perrhenate, potassium selenate, potassium silicate, potassium sulfite, potassium sulfate, potassium thiosulfate, potassium disulfite, potassium dithionate, potassium disulfate, potassium peroxodisulfate, potassium dihydrogen arsenate, dipotassium hydrogen arsenate, potassium hydrogen carbonate, potassium dihydrogen phosphate, dipotassium hydrogen phosphate, potassium hydrogen selenate, potassium hydrogen sulfite, potassium hydrogen sulfate, or potassium hydrogen peroxosulfate.

For example, the additive may be barium sulfite, barium chloride, barium chlorate, barium perchlorate, barium peroxide, barium chromate, barium acetate, barium cyanide, barium bromide, barium oxalate, barium nitrate, barium hydroxide, barium hydride, barium carbonate, barium iodide, barium sulfide, or barium sulfate. In addition, the additive may be sodium acetate or sodium citrate.

The additive may be fine particles or nanoparticles of metal oxides, and examples of the metal oxides include sodium oxide, calcium oxide, lithium oxide, boron oxide, potassium oxide, barium oxide, silicon oxide, titanium oxide, zirconium oxide, aluminum oxide, zinc oxide, and magnesium oxide.

In the method for producing the electronic component 10 of the aforementioned embodiment, the metal alkoxide 85 is not limited to the examples in the aforementioned embodiment. Examples of the element that can synthesize the metal alkoxide 85 include Li, Be, B, C, Na, Mg, Al, Si, P, K, Ca, Sc, Ti, V, Cr, Mn, Fe, Co, Ni, Cu, Zn, Ga, Ge, As, Rb, Sr, Y, Zr, Nb, Mo, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Hg, Tl, Pb, Bi, Th, Pa, U, and Pu. The alkoxides of these elements can be used as a precursor of glass.

For example, the metal alkoxide 85 may be sodium methoxide, sodium ethoxide, calcium diethoxide, lithium isopropoxide, lithium ethoxide, lithium tert-butoxide, lithium methoxide, boron alkoxide, potassium t-butoxide, tetraethyl orthosilicate, allyltrimethoxysilane, isobutyl (trimethoxy)silane, tetrapropyl orthosilicate, tetramethyl orthosilicate, [3-(diethylamino)propyl]trimethoxysilane, triethoxy(octyl)silane, triethoxyvinylsilane, triethoxyphenylsilane, trimethoxyphenylsilane, trimethoxymethylsilane, butyltrichlorosilane, n-propyltriethoxysilane, methyltrichlorosilane, dimethoxy(methyl)octylsilane, dimethoxydimethylsilane, tris(tert-butoxy)silanol, tris(tert-pentoxy)silanol, hexadecyltrimethoxysilane, dipotassium tris(1,2-benzenediolate-0,0')silicate, tetrabutyl orthosilicate, aluminum silicate, calcium silicate, a tetramethylammonium silicate solution, chlorotriisopropoxytitanium(IV), titanium(IV) isopropoxide, titanium(IV) 2-ethylhexyl oxide, titanium(IV) ethoxide, titanium(IV) butoxide, titanium(IV) tert-butoxide, titanium(IV) propoxide, titanium(IV) methoxide, zirconium (IV) bis(diethyl citrate) dipropoxide, zirconium(IV) dibutoxide (bis-2,4-pentanedionate), zirconium(IV) 2-ethylhexanoate, a zirconium(IV) isopropoxide isopropanol complex, zirconium(IV) ethoxide, zirconium(IV) butoxide, zirconium(IV) tert-butoxide, zirconium(IV) propoxide, aluminum tert-butoxide, aluminum isopropoxide, aluminum ethoxide, aluminum-tri-sec-butoxide, or aluminum phenoxide.

In the method for producing the electronic component of the aforementioned embodiment, a metal complex or an acetate salt that serves as a precursor of the metal alkoxide may be used instead of the metal alkoxide 85. In such a case, in the metal alkoxide injection step S17, the metal complex or the acetate salt that serves as a precursor of the metal alkoxide may be injected. Examples of the metal complex include acetyl acetonates such as lithium acetylacetonate, titanium(IV) oxyacetylacetonate, titanium diisopropoxide bis(acetylacetonate), zirconium(IV) trifluoroacetylacetonate, zirconium(IV) acetylacetonate, aluminum acetylacetonate, aluminum(III) acetylacetonate, calcium(II) acetylacetonate, and zinc(II) acetylacetonate. In addition, the examples of the acetate salt include zirconium acetate, zirconium(IV) acetate hydroxide, and basic aluminum acetate.

In the method for producing the electronic component of the embodiment described above, the outer electrode forming step is not limited to the examples in the aforementioned embodiment. For example, the insulating film 50 may be solidified by performing a heat treatment after the film forming step S18, and then the conductor applying step S20 and the solidifying step S21 may be performed to form the first outer electrode 61 and the second outer electrode 62. In addition, for example, as described in the modification example above, when some portion of the first inner electrodes 41 is exposed from the insulating film 50, the first outer electrode 61 may be formed on the exposed portion by a plating technique.

The solidifying step S21 is not limited to the step of solidifying the insulating film 50 and the conductor paste simultaneously. For example, if the conductor paste is a material solidified by UV irradiation, a heating step may be performed as the solidifying step of solidifying the insulating film 50 and then UV irradiation may be performed as the step of solidifying the conductor paste.

In the method for producing the electronic component described above, the insulating film 50 may be solidified in the drying step S19 by sufficiently evaporating water and the polymer 84. In such a case, the drying step S19 functions as the solidifying step of solidifying the insulating film 50.

In the method for producing the electronic component described above, the order in which the solvent injection step S13, the catalyst injection step S14, and the element body injection step S15 are performed may be any. This is as long as the metal alkoxide 85 reacts with the catalyst in the reactor 81 in the state in which the solvent 82, the element body 20, and the polymer 84 are injected into the reactor 81.

In the method for producing the electronic component described above, the polymer 84 is not limited to polyvinylpyrrolidone. For example, the polymer 84 may be a homopolymer or a copolymer of acrylics, such as acrylic acid or methacrylic acid, or esters thereof. Examples of the acrylics include acrylic acid ester copolymers, methacrylic acid ester copolymers, and acrylic acid ester-methacrylic acid ester copolymers. For example, the polymer 84 is a homopolymer or a copolymer of cellulose, polyvinyl alcohol, polyvinyl acetate, polyvinyl chloride, or polypropylene carbonate. Examples of the cellulose include hydroxypropyl cellulose, cellulose ether, carboxymethyl cellulose, acetylcellulose, and acetylnitrocellulose. The polymer 84 may contain multiple polymers and may contain at least one selected from those examples described above.

In the method for producing the electronic component of the aforementioned embodiment, the solvent 82 is not limited to 2-propanol. The solvent 82 may be changed as appropriate as long as the metal alkoxide 85 can be sufficiently dispersed.

Meanwhile, the film forming method disclosed in Japanese Unexamined Patent Application Publication No. 2020-36002 includes a solvent injection step, a catalyst injection step, an element body injection step, and a metal alkoxide injection step. Moreover, the film forming method includes a film forming step. In the film forming step, an insulating film made of silicon oxide is formed on the outer surface of the element body by hydrolysis and polycondensation reaction of a metal alkoxide.

According to the film forming method disclosed in Japanese Unexamined Patent Application Publication No. 2020-36002, the size of silicon oxide may become excessively large. When large silicon oxide particles are present on the surface of the insulating film and when the impact is applied to the vicinity of these particles from outside the element body 20, these particles may cause delamination of the insulating film 50 in the vicinity from the outer surface 21 of the element body 20.

According to the film forming method in the method for producing the electronic component 10 described above, the polymer 84 is injected in the polymer injection step S16. During the process of forming the insulating film 50, the polymer 84 adsorbs onto the outer surface 21 of the element body 20. In the subsequent metal alkoxide injection step S17, the glass fine particles derived from the metal alkoxide 85 are captured by the polymer 84. Thus, coarse glass particles that have grown excessively can no longer be captured by the polymer 84. As a result, excessively large particles are not contained in the insulating film 50.

As such, from the viewpoint of reducing the excessive growth of glass coarse particles, the mix layer 51 in the insulating film 50 is not an essential feature. In other words, for example, the insulating film 50 may be solely constituted by the glass 57.

Moreover, the glass coarse particles can be further made smaller by controlling the concentration of the metal alkoxide 85, the alkali concentration, the reaction temperature, the reaction time, the type of the solvent 82, the surface charges of the element body 20, etc.

A technical idea that can be identified from the aforementioned embodiments and modification examples is as follows.

<Appendix 1>

A film forming method for forming a metal oxide-containing insulating film on an outer surface of an element body, the method including: injecting the element body into a reactor; injecting, into the reactor, a polymer that adsorb onto an outer surface of the element body; injecting, into the reactor, a metal alkoxide or a metal alkoxide precursor; injecting, into the reactor, a catalyst that accelerates hydrolysis of the metal alkoxide; and subjecting the metal alkoxide to hydrolysis and dehydration synthesis so as to form the insulating film on the outer surface of the element body.

REFERENCE SIGNS LIST

10 electronic component
20 element body
21 outer surface
41 first inner electrode
42 second inner electrode
50 insulating film 51 mix layer
52 glass
53 powder particles
56 glass layer
57 glass
58 crack
61 first outer electrode
62 second outer electrode
71 first penetrating portion
72 second penetrating portion
81 reactor
82 solvent
83 aqueous solution
84 polymer
85 metal alkoxide

The invention claimed is:

1. An electronic component comprising:
an element body; and
an insulating film covering an outer surface of the element body,
wherein the insulating film includes a mix layer that contains a first glass and powder particles, and a glass layer that contains a second glass and has a smaller content percentage of the powder particles than the mix layer,
the mix layer is on a side of the insulating film closer to the element body when viewed from the glass layer,
wherein, in a cross-sectional view orthogonal to the outer surface of the element body, a powder particle farthest from the outer surface of the element body is designated as a specified powder particle, a first distance from the outer surface of the element body to a specified point in the specified powder particle that is farthest from the outer surface of the element body is larger than a second distance from the specified point to a surface of the glass layer,
wherein a thermal expansion coefficient of the powder particles is larger than a thermal expansion coefficient of the glass, and
wherein the thermal expansion coefficient of the powder particles is $0.6 \times 10^{-6}$ to $15 \times 10^{-6}$ (/K).

2. The electronic component according to claim 1, further comprising:
an outer electrode on the insulating film, and
the outer electrode includes a metal layer.

3. The electronic component according to claim 1, wherein a material of the powder particles is the same as a material of the element body.

4. The electronic component according to claim 1, wherein the powder particles have an average particle diameter of 100 nm or more.

5. The electronic component according to claim 1, wherein the insulating film has a crack that opens to a surface of the glass layer opposite from the mix layer and the crack does not reach the element body.

6. The electronic component according to claim 1, wherein a material of the element body is a ceramic, and the mix layer directly covers the outer surface of the element body without other layers interposed therebetween.

7. The electronic component according to claim 6, wherein a material of the powder particles is the same as a material of the element body.

8. The electronic component according to claim 1, wherein a material of the powder particles is a ceramic.

9. The electronic component according to claim 8, wherein the ceramic contains at least one element selected from Mn, Fe, Ni, Co, Ti, Ba, Al, and Zn.

10. The electronic component according to claim 1, wherein the second glass in the glass layer is integrated with the first glass in the mix layer.

11. The electronic component according to claim 1, wherein the first glass and the second glass are silicon dioxide.

12. The electronic component according to claim 1, wherein the first glass and the second glass are selected from Si-containing multicomponent oxide, multicomponent oxides containing an alkali metal and Si, and multicomponent oxides containing an alkaline earth metal and Si.

* * * * *